United States Patent
Savant et al.

(10) Patent No.: US 9,129,083 B2
(45) Date of Patent: Sep. 8, 2015

(54) AUTOMATIC COMPUTATION OF REFLECTED MASS AND REFLECTED INERTIA

(75) Inventors: Shrikant Vitthal Savant, Shrewsbury, MA (US); Kyeong Hwi Lee, Lexington, MA (US)

(73) Assignee: Dassault Systems SolidWorks Corporation, Waltham, MA (US)

( * ) Notice: Subject to any disclaimer, the term of this patent is extended or adjusted under 35 U.S.C. 154(b) by 147 days.

(21) Appl. No.: 13/172,050

(22) Filed: Jun. 29, 2011

(65) Prior Publication Data

US 2013/0006586 A1    Jan. 3, 2013

(51) Int. Cl.
*G06G 7/48* (2006.01)
*G06F 17/50* (2006.01)

(52) U.S. Cl.
CPC ............ *G06F 17/5086* (2013.01); *Y02T 10/82* (2013.01)

(58) Field of Classification Search
USPC ............................................................ 703/6
See application file for complete search history.

(56) References Cited

U.S. PATENT DOCUMENTS

| | | | | |
|---|---|---|---|---|
| 6,650,078 | B1 * | 11/2003 | Chaffee | 318/630 |
| 2010/0059944 | A1 * | 3/2010 | Oteman et al. | 280/6.157 |
| 2010/0063790 | A1 * | 3/2010 | Truscott et al. | 703/8 |
| 2013/0006589 | A1 * | 1/2013 | Gorur Narayana Srinivasa | 703/1 |

OTHER PUBLICATIONS

Voss, W., "A comprehensive Guide to Servo Motor Sizing," MA : Copperhill Technologies Corporation, 2007.*
Mazurkiewicz, J., "The basics of Motion Control—Part 1," Power Transmission Design,pp. 43-45, Sep. 1995.*
Arumugom et al. ("Modeling and Application of Series Elastic Actuators for Force Control Multi Legged Robots", Journal of Computing, vol. 1, Issue 1, Dec. 2009, pp. 26-33).*
Nick Repanich ("The Myth of Inertia Matching ", California State University, Chico Chico, CA, 1992, pp. 1-4).*
Wilfried Voss ("A Comprehensible Guide to Servo Motor Sizing", Copperhill Technologies Corporation,2007, pp. 1-158).*
Armstrong, R.W., Jr., "Load to Motor Inertia Mismatch: Unveiling the Truth," *Drives and Controls Conference*, Telford, England, pp. 1-13, 1998, available at http://www.diequa.com/download/articles/inertia.pdf.

(Continued)

*Primary Examiner* — Omar Fernandez Rivas
*Assistant Examiner* — Iftekhar Khan
(74) *Attorney, Agent, or Firm* — Hamilton, Brook, Smith & Reynolds, P.C.

(57) ABSTRACT

Automatically computing the reflected mass or reflected inertia of a computer-aided design model comprised of a motor includes executing a simulation of the model, using the simulation results to compute the reflected mass or reflected inertia, and treating the non-motor parts of the model as a virtual body having a time-varying mass or a time-varying inertia. The mass or inertia of the virtual body at a specific time is the reflected mass or reflected inertia, respectively, of the model at the specific time.

17 Claims, 6 Drawing Sheets

(56) References Cited

OTHER PUBLICATIONS

Mazurkiewicz, J., "The basics of Motion Control—Part 1," *Power Transmission Design*, pp. 43-45 (Sep. 1995).
Mazurkiewicz, J., "The basics of Motion Control—Part 2," *Power Transmission Design*, pp. 35-37 (Mar. 1996).
Mazurkiewicz, J., "Load Inertia and Motor Selection," 3 pages, available at www.docstoc.com, posted May 31, 2010.
Voss, W., *A Comprehensive Guide to Servo Motor Sizing*, (MA: Copperhill Technologies Corporation), pp. 59-60, 96-102 (2007).
"SolidWorks Simulation; Drive market-winning innovation, without risk", Product Development Sheet, Dassault Systemes SolidWorks Corp. (2011).
"SolidWorks Simulation; Innovation is about taking chances, not taking risks", Product Development Sheet, Dassault Systemes SolidWorks Corp. (2010).

* cited by examiner

US 9,129,083 B2

AUTOMATIC COMPUTATION OF REFLECTED MASS AND REFLECTED INERTIA

FIELD

This application relates to Computer-Aided Design (CAD), and more particularly, to the computation of reflected mass and reflected inertia of a CAD model representing a real-world object.

BACKGROUND OF THE INVENTION

Computer-aided design (CAD) software allows a user to construct and manipulate complex three-dimensional (3D) models. A number of different modeling techniques can be used to create a 3D model. One such technique is a solid modeling technique, which provides for topological 3D models where the 3D model is a collection of interconnected topological entities (e.g., vertices, edges, and faces). The topological entities have corresponding supporting geometrical entities (e.g., points, trimmed curves, and trimmed surfaces). The trimmed surfaces correspond to the topological faces bounded by the edges. CAD systems may combine solid modeling and other modeling techniques, such as parametric modeling techniques. Parametric modeling techniques can be used to define various parameters for different features and components of a model, and to define relationships between those features and components based on relationships between the various parameters.

A design engineer is a typical user of a 3D CAD system. The design engineer designs physical and aesthetic aspects of 3D models, and is skilled in 3D modeling techniques. The design engineer creates parts and may assemble the parts into a subassembly. Parts and subassemblies may then be used to design an assembly. Additionally, a design engineer may wish to run a simulation in order to better analyze the design of a subassembly or an assembly model. Analyzing simulation results can give a design engineer valuable information about kinematic and dynamic responses of the model, by way of non-limiting example. With the ability to simulate an assembly before the assembly is manufactured, the design engineer can test the design virtually without incurring the overhead associated with the manufacturing process. Virtually testing a design before manufacturing physical parts can lead to considerable cost and time savings because the product design can be tested before the actual product is manufactured and various design changes can be tested quickly and effectively. Commercially available modeling and simulation systems include the SolidWorks® 2011 software and SolidWorks® 2011 Simulation systems available from Dassault Systèmes SolidWorks Corporation of Concord, Mass.

When designing an assembly containing a motor, a design engineer may want to compute the reflected mass or reflected inertia of the assembly. Reflected mass (sometimes referred to as reflected load mass) is the mass of an entire mechanism sensed by a linear motor at the motor drive shaft. Reflected inertia (sometimes referred to as reflected load inertia) is the inertia of an entire mechanism sensed by a rotary motor at the motor drive shaft. Reflected mass and reflected inertia data aids the design engineer in determining whether the selected motor is the most efficient and cost effective for the real-world mechanism being designed. Current methods for computing reflected mass and reflected inertia use manual calculations and the results may be approximate because dynamic effects such as the time rate of change of reflected mass or reflected inertia (i.e., the rate in which reflected mass or reflected inertia changes with respect to time), are not taken into account, and thus, the results are not always accurate. Further, current methods compute reflected mass and reflected inertia of a mechanism at a specific motor location and only in a specific configuration in which various parts are frozen in time. Thus, such a computation is valid only for a specific position of the mechanism and cannot easily provide the time variation at all possible configurations (positions) of the mechanism. To obtain results via a manual computation procedure is very tedious and can quickly become very difficult for a moderately complex mechanism.

Selecting a proper motor that drives a mechanism for a particular task is a critical task during the design phase of the mechanism in terms of efficiency, cost, and performance. With regards to efficiency, selecting a higher capacity motor than needed results in the motor being under-utilized, thereby leading to higher power consumption than necessary and other inefficiencies, for example, higher cost to purchase and install the motor, higher operating costs, and a bulkier design. On the other hand, selecting a lower capacity motor than needed may lead to the motor overheating, being unable to perform the desired task, or breaking down. With regards to costs, ensuring that a selected motor is not larger and more expensive than needed helps control costs of a product. Performance is also a prime consideration when selecting a motor. If a motor does not have the proper inertia there will be a mismatch of motor inertia and load inertia, and mismatched inertia may lead to unacceptable vibrations of the mechanism. In addition, "inertia mismatches require higher current to drive the motor, thus [dissipating] more power," according to John Mazurkiewicz in a paper titled Load Inertia and Motor Selection (see www.motioncontrolonline.org/files/public/Load_Inertia_Motor_Selection.pdf).

Usually, reflected mass and reflected inertia are computed using a static snapshot of the mechanism that considers the loading conditions at one particular instant in time. Moreover, the reflected mass and reflected inertia computations depend upon how various parts in the mechanism are coupled, and as mentioned, are usually computed manually. Effects of other forces such as friction, gravity, and external loads are usually accounted for in an approximate fashion, for example, by reflecting external loads across the transmission system with a known transmission ratio. However, when the path from the external load to the motor involves complicated chains of linkages and joints, such a process is neither easy nor obvious. Thus, the manual computations are seldom exact. As the mechanism actuates, positions of different parts change and internal and external loads on the mechanism change as well. All of these affect reflected mass in the case of a linear motor and reflected inertia in the case of a rotary motor, in a very complex fashion. Therefore, manually computing reflected mass and reflected inertia at every position to find a motor's time variation is by and large a very tedious and difficult task.

Time-saving advantages and enhancements to state of the art CAD systems could be achieved by providing an efficient and more accurate means of computing reflected mass and reflected inertia of computer-aided design models containing motors.

SUMMARY OF THE INVENTION

In general, in one aspect, the invention features a computer-implemented method for computing the reflected mass or the reflected inertia of a real-world object represented as a model generated by a computer-aided design system. The method includes constructing components of the model where one component represents a motor and the non-motor components of the model are represented as a single virtual body. If the motor is a linear motor, a formulation determines how the mass of the single virtual body changes over time and the mass at a specific time is the reflected mass of the model at the specific time. If the motor is a rotary motor, the formulation determines how the inertia of the single virtual body changes over time and the inertia at the specific time is the reflected inertia of the model at the specific time. A dynamic simulation of the model is executed, which interacts with a solver that provides inputs to the formulation. Applying the formulation determines the reflected mass when the motor is a linear motor and the reflected inertia when the motor is a rotary motor. Additionally, information is presented depicting the determined reflected mass and reflected inertia.

Implementations may include performing an initial conditions analysis, where any non-zero value represents acceleration of the single virtual body and a zero value represents the velocity of the single virtual body. Further, information may be presented as a graph displayed on a computer monitor showing the reflected mass or reflected inertia varying over time and the graph may be created and displayed on the computer monitor while the dynamic simulation is executing.

Other implementations may include accounting for an external load when executing the dynamic simulation, where the external load is gravity, friction, or an external force. Additionally, applying the formulation can include integrating one of force or torque when a velocity at the specific time is non-zero, determining a ratio of one of force or torque with respect to acceleration when the velocity at the specific time is a zero value and an acceleration at the specific time is non-zero, and using a result from a time step preceding the specific time.

The details of one or more embodiments of the invention are set forth in the accompanying drawings and the description that follows. Other features, objects, and advantages of the invention will be apparent from the description and drawings, and from the claims.

DETAILED DESCRIPTION OF THE INVENTION

The present invention automatically computes the time variation of reflected mass for linear motors and the time variation of reflected inertia for rotary motors for a mechanism driven by one or more linear or rotary motors modeled using a computer-aided design system. Reflected mass or reflected inertia as determined by the present invention is the mass sensed by a linear motor or the inertia sensed by a rotary motor, respectively, at a location on the motor's drive shaft as a function of time. The time factor correlates to a dynamic simulation of the mechanism, which accounts for external loads and motions applied to the mechanism over a desired time interval. Additionally, the present invention provides feedback of the minimum, maximum, average, and root mean square (RMS) values of reflected mass and reflected inertia. Such feedback occurs while a simulation is executing or as a post-processing stage after the simulation completes.

Figure 1:
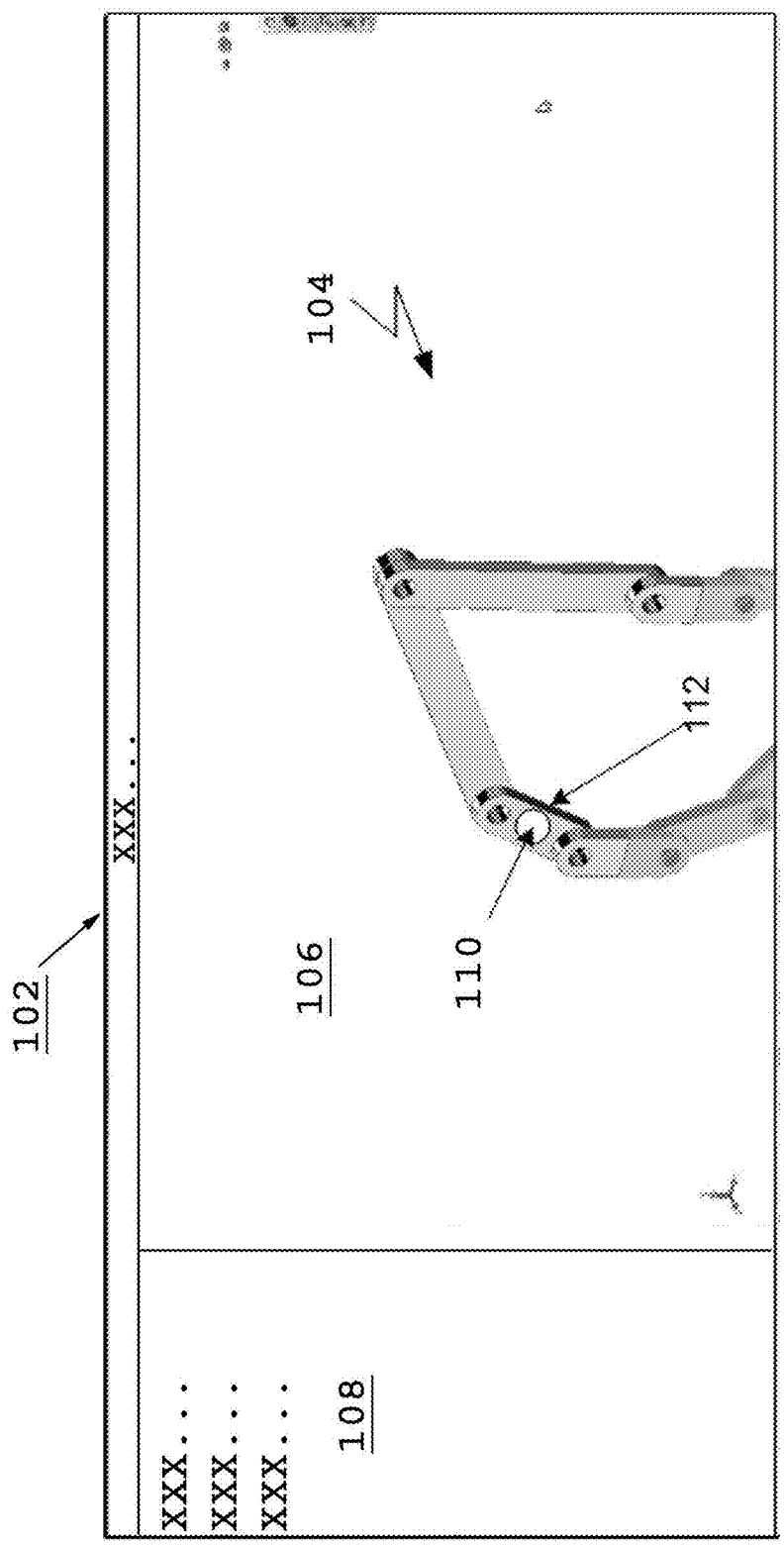
FIG. 1 is an illustration of a computer-generated model and a feature manager portion of the user interface displayed in a window in one embodiment of the present invention.

Referring now to FIG. 1, a window 102 displayed on a computer monitor is shown. The window 102 is generated by modeling software executed by a computerized modeling system, an example of which is later shown with reference to FIG. 6. The window 102 is a conventional computer-generated window that can be programmed by one of ordinary skill in the art using conventional, commercially available, software programming tools, such as those available from Microsoft Corporation of Redmond, Wash.

A computer-generated 3D model 104 is displayed within a modeling portion 106 of the window 102. Implementations of the present invention also may include other window areas, such as a FeatureManager® window panel 108 in which the structure of an part, subassembly, or assembly is listed to help the design engineer visualize and manipulate the 3D model 104, as well as components of the 3D model 104.

For exemplary purposes, the model 104 includes among other design elements a simple four-bar mechanism driven by a constant speed 60 rpm rotary motor 110 mounted on a first link 112. To analyze the structural behavior of the mechanism, a computer-based dynamic simulation may be used to predict the real-world performance of the mechanism. Such a dynamic simulation may be provided for by commercially available software, such as SolidWorks® Motion software developed by Dassault Systèmes SolidWorks Corporation of Concord, Mass.

Figure 2:
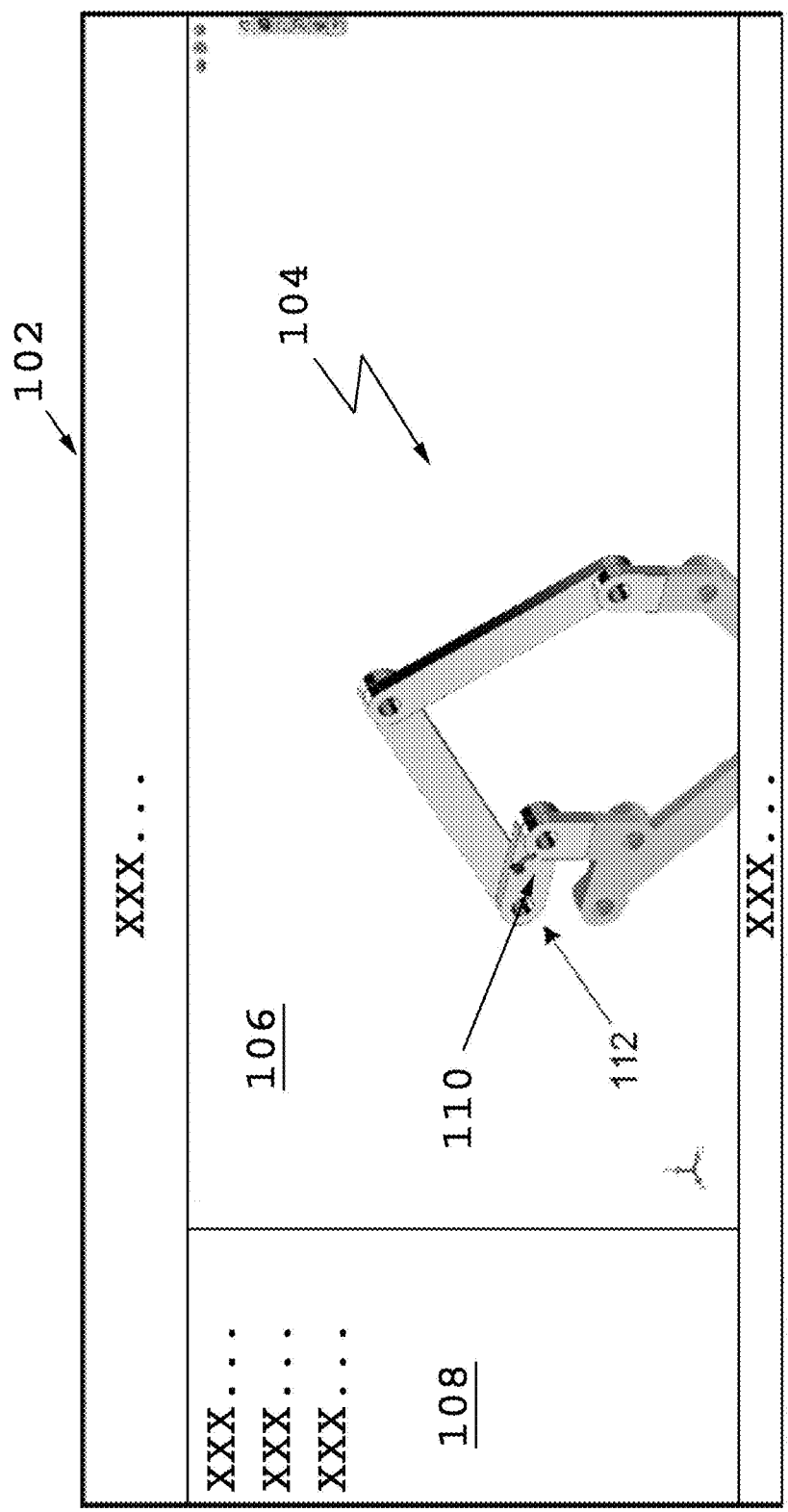
FIG. 2 is an illustration of the computer-generated model shown in FIG. 1 in a different configuration.

Referring now to FIG. 2, the computer-generated 3D model 104 is shown at a different time interval during a dynamic simulation that drives the rotary motor 110 at a constant speed. In FIG. 2, the rotary motor 110 has driven the first link 112 to a different position than that depicted in FIG. 1 and the remaining parts of the 3D model 104 have re-positioned themselves in response.

Figure 3:
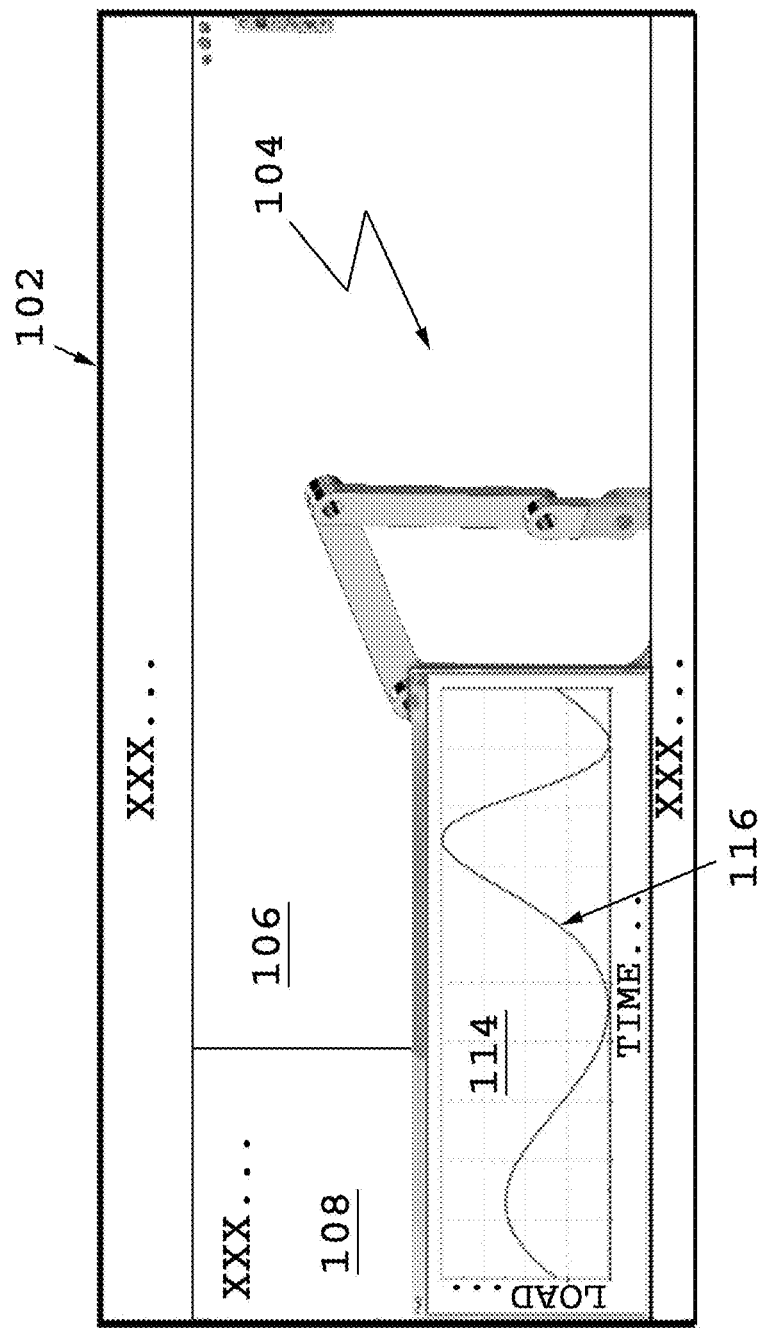
FIG. 3 is an illustration of the computer-generated model shown in FIG. 1 and a plot representing reflected inertia.

Referring now to FIG. 3, a plot 114 of the reflected inertia curve 116 overlaid on the 3D model 104 is illustrated. The x-axis of the plot 114 indicates time and the y-axis of the plot 114 indicates a value for reflected load inertia. In an embodiment, such a plot 114 may be created after a dynamic simulation completes and a process that computes the reflected load inertia of the rotary motor 110 is initiated, which may be accomplished via user interface tools. Alternatively, the present invention may compute the reflected load inertia of the rotary motor 110 during the simulation process and build the plot as an on-going process.

As illustrated by the reflected inertia curve 116, the reflected inertia value varies with time as the positions of the parts in the mechanism represented by 3D model 104 change with time. Moreover, the reflected inertia value is the inertia of the modeled mechanism sensed by the rotary motor 110 at a location on the shaft of the rotary motor 110.

The model 104 described with reference to FIGS. 1, 2, and 3 exemplifies the present invention when a model includes a rotary motor. A model in another example embodiment may include a linear motor, for which the results from a dynamic simulation are used as input to a process that determines the reflected mass for that model. The reflected mass value with respect to time may also be visualized as a plot displayed in the window 102.

In preferred embodiments, reflected mass or reflected inertia are the mass or the inertia, respectively, sensed by a motor at a location on the motor's shaft without regard to specific modeling details of the mechanism. Disregarding the specific modeling details, the non-motor components of the mechanism are represented by a single virtual body that is driven by the motor in such a way that the single virtual body conceptually increases or decreases in mass or inertia over time in exactly the same way as the mass or inertia of the rest of the mechanism sensed at that point. Applying a law of motion to the single virtual body to compute the mass or inertia of the single virtual body at each regular increment over a desired time interval produces values of the reflected mass or reflected inertia of the mechanism at the location of the linear or the rotary motor, respectively, over the desired time interval. Due to the computation of the mass or inertia of the single body being based on a law of motion determines the rate in which linear or angular momentum of a body changes with respect to time, which is equal to the net force or torque, respectively, acting on the body along the direction of motion.

To compute the mass and inertia of the single virtual body, the present invention employs the following formulations, the first of which is for linear motion based on Newton's law of translational motion. These formulations form the first order differential equations that are integrated subject to the initial conditions to obtain the time variation of the reflected mass $m_r(t)$ and reflected inertia $I_r(t)$.

For linear motion,
$m_r(t)$=Mass of the single virtual body, which is the same as the reflected mass of the mechanism at the motor location at time t.
$\dot{m}_r$=Time rate of change of mass of the single virtual body.
$v(t)$=Velocity of the motor drive shaft.
$\alpha(t)$=Acceleration of the motor drive shaft.
$F(t)$=Force applied by the motor at time t.

Applying Newton's law of linear motion to the virtual body results in the formulation $d(m_r v)/dt=F$, and expanding the formulation results in $m_r \alpha + \dot{m}_r v = F$, where $\alpha=dv/dt$, $\dot{m}_r=d(m_r)/dt$, and where $m_r(0)=m_{r0}$ is the initial condition (i.e., at t=0).

For rotary motion, a preferred embodiment implements the following formulation:
$I_r(t)$=Mass moment of inertia of the single virtual body, which is the same as the reflected inertia of the mechanism at the motor location at time t.
$\dot{I}_r$=Time rate of change of mass moment of inertia of the single virtual body.
$\omega(t)$=Angular velocity of the motor drive shaft at time t.
$\alpha(t)$=Angular acceleration of the motor drive shaft at time t.
$T(t)$=Torque applied by the motor at time t.

Applying Newton's law of rotational motion to the virtual body results in the formulation $d(I_r \omega)/dt=T$, and expanding that formulation results in $I_r \alpha + \dot{I}_r \omega = T$, where $\alpha=d\omega/dt$ and $\dot{I}_r=d(I_r)/dt$, and where $I_r(0)=I_{r0}$ is the initial condition (i.e., at t=0).

Figure 4:
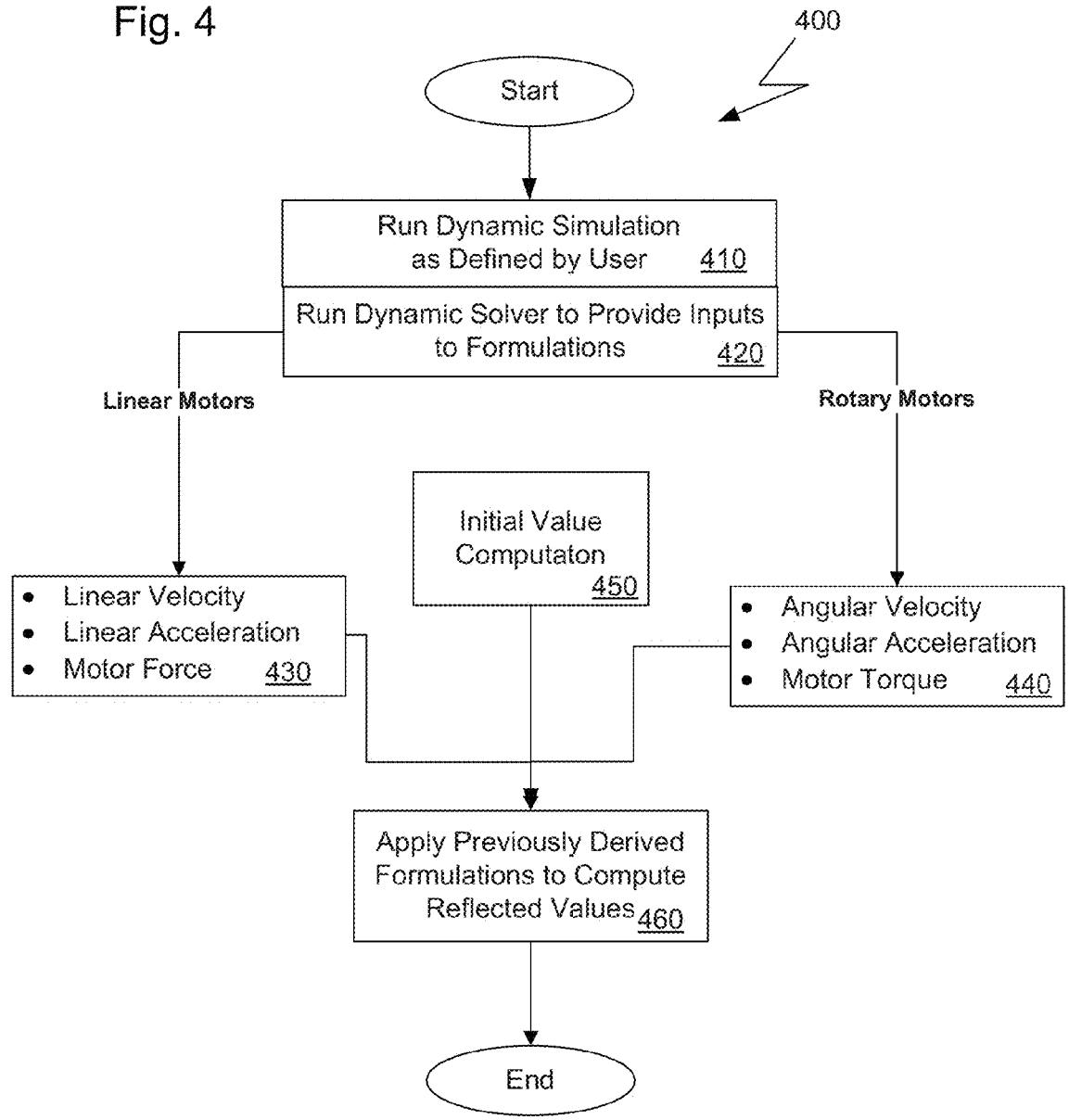
FIG. 4 is a schematic diagram depicting the data flow between components in an embodiment of the present invention.

Referring now to FIG. 4, a procedure 400 illustrates an embodiment of the present invention. In the first step, a dynamic simulation of a mechanism being modeled is executed (Step 410). The dynamic simulation utilizes user-specified parameter values such as external loads, duration, spring and damper behaviors, and gravity. Such a dynamic simulation may be achieved using SolidWorks® Motion software (as previously noted), which performs linear and non-linear dynamic analysis of systems subjected to a dynamic loading environment. Once the dynamic simulation completes, a dynamic solver provides data as a function of time over the entire time duration of the simulation (Step 420). Such a dynamic solver that may be used is the ADAMS/Solver in the ADAMS products available from MSC Software of Santa Ana, Calif.

The data output by the dynamic solver is then used as input to apply the previously derived formulations (Step 460 in procedure 400). If the mechanism is driven by a linear motor, the data used as input are linear velocity, linear acceleration, and motor force (Step 430); whereas, if the mechanism is driven by a rotary motor, the data used as input are angular velocity, angular acceleration, and motor torque (Step 440).

In an embodiment, the dynamic simulation (Step 410) provides data to the dynamic solver (Step 420) as the dynamic simulation data is available, rather than after the simulation completes. In this embodiment, the dynamic solver process (Step 420) may then provide the velocity, acceleration, force, or torque data as that data becomes available for a particular instant of time, rather than waiting for the entire data set over the entire time period to be available before processing of the data begins. Thus, a user may be able to see a curve depicting reflected values as the curve is being created. Additionally, the visualization of the reflected mass or inertia values may seem to be occurring in real time.

Prior to applying the derived formulations, the value at the start of the curve is determined (Step 450). The value, which is necessary to achieve a complete solution, is an initial value for reflected mass or an initial value for reflected inertia. To compute the initial value of the reflected mass, denoted as $m_{r0}$, and the initial value of reflected inertia, denoted as $I_{r0}$, at the initial time t=0 all external loads acting on the mechanism being modeled, including gravity, are disregarded. Then, for linear motors, a non-zero constant linear acceleration is applied, where any non-zero value may be used; whereas, for rotary motors, a non-zero constant angular acceleration is applied, where any non-zero value may be used. All the corresponding initial velocities are set to zero.

Computing an initial value requires, in general, solving the formulations for t=0 via initial conditions analysis to obtain the value of the force required at the initial time for linear motors, denoted as $F(0)$, and the value of torque required at the initial time for rotary motors, denoted as $T(0)$. Alternatively, one can also run the simulation for a very short duration of time to compute the value of the force required at the initial time for linear motors and torque required at the initial time for rotary motors. The initial values of the reflected mass $m_{r0}$ and reflected inertia $I_{r0}$ can then be computed as $m_{r0}=F(0)/\alpha(0)$ and $I_{r0}=T(0)/\alpha(0)$, respectively.

In the next step, the previously derived formulations are applied (Step 460). As previously discussed, the formulations form the first order differential equations that are integrated subject to the initial conditions to obtain the time variation of the reflected mass denoted as $m_r(t)$ and reflected inertia denoted as $I_r(t)$. Various cases are considered while solving these equations, where the first case listed in which velocity is non-zero are the most frequent. For linear motion Case 1. If $v(t) \neq 0$, at time t, integrating the law of motion equation, results in:

$m_r(t)v(t) = \int_0^t F(t)dt + m_{r0}v_0$

Which for all t, results in:

$$m_r(t) = \frac{\left[\int_0^t F(t)\,dt + m_{r0}v_0\right]}{v(t)}$$

Case 2. If $v(t)=0$, but $\alpha(t) \neq 0$ at time t, from the expanded law of motion equation, the result is $m_r(t)=F(t)/\alpha(t)$.

Case 3. If v(t)=0, and α(t)=0 at time t, the result from the previous time step is used:
  $m_r(t)=m_r(t_{prev})$, where, $t_{prev}$ is the value of time at the previous time step.
Cases considered while solving for rotary motion are as follows:
Case 1. If ω(t)≠0, integrating the law of motion equation results in:

$$I_r(t)\omega(t)=\int_0^t T(t)dt+(I_{r0}\omega_0)$$

Which for all t results in:

$$I_r(t)=[\int_0^t T(t)dt+(I_{r0}\omega_0)]/\omega(t)$$

Case 2. If ω(t)=0, but α(t)≠0 at time t, from the expanded law of motion equation the result is $I_r(t)=T(t)/\alpha(t)$.
Case 3. If ω(t)=0, and α(t)=0 at time t, the result from the previous time step is used, that is, $I_r(t)=I_r(t_{prev})$, where, $t_{prev}$ is the value of time at the previous time step.

Figure 5:
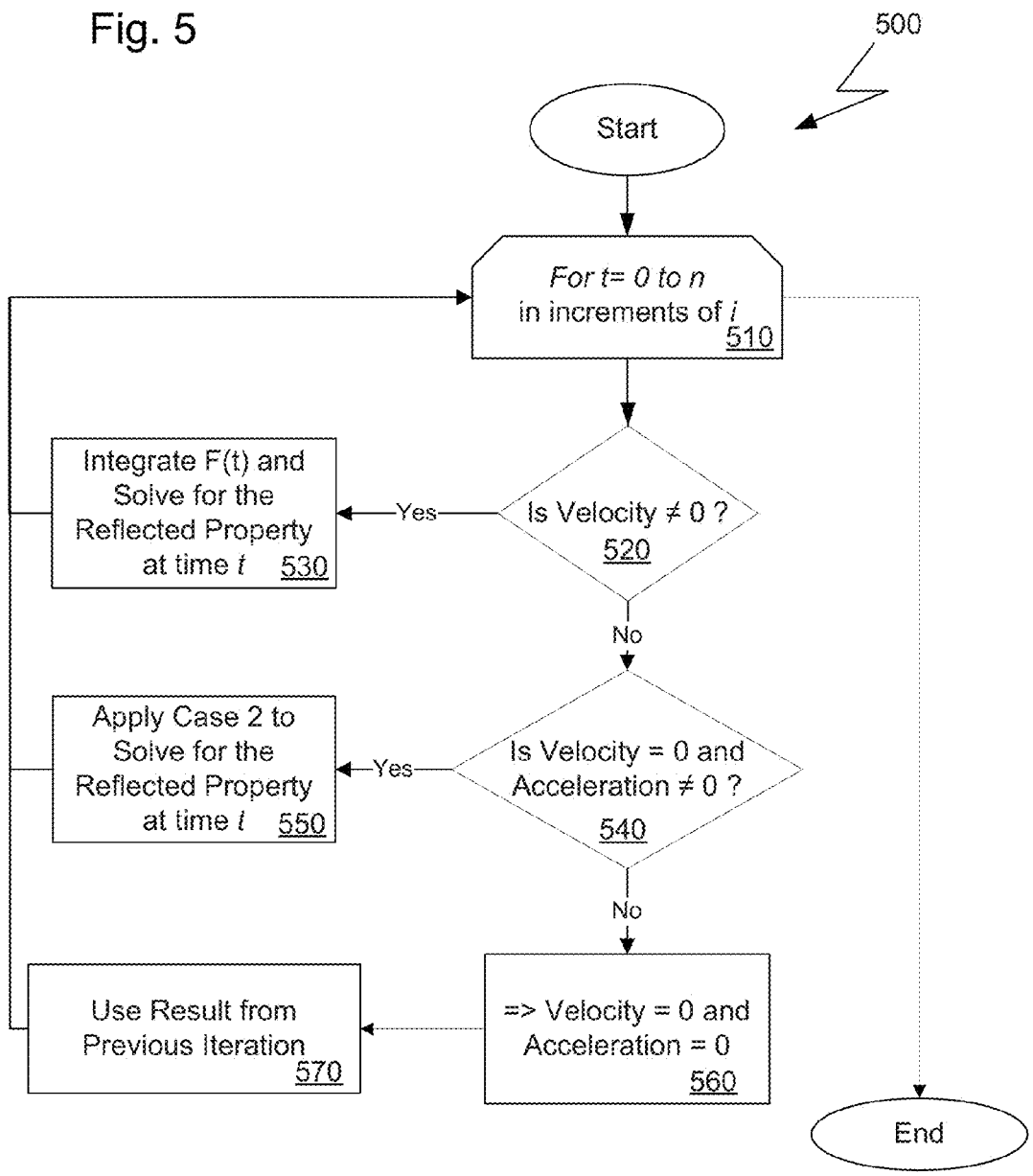
FIG. 5 is a schematic diagram depicting the data flow in an embodiment of the present invention.

Referring now to FIG. 5, a procedure 500 illustrates Step 460 in FIG. 4 in more detail. To begin, procedure 500 establishes a desired time interval n divided into increments of i over which the steps that follow in procedure 500 will be executed (Step 510). The time interval and increments correlate to the desired time interval and increments employed in the dynamic simulation executed during Step 410 of FIG. 4. In the next step, if the velocity is non-zero (Step 520), the force or torque applied by the motor at time t is integrated with respect to time from 0 to the value of t in the current iteration and once the force or torque is integrated, the reflected property of the single virtual body at time t is computed (Step 530). The next step determines if the velocity is zero and the acceleration is non-zero (Step 540), and if so, the applicable Case 2 for linear or rotary motion, as was previously discussed, is applied to solve for the reflected property for time t (Step 550). Procedure 500 may also determine that the velocity and the acceleration are zero (Step 560), and if so, the solution from the previous time iteration is the solution for the current iteration (Step 570).

Figure 6:
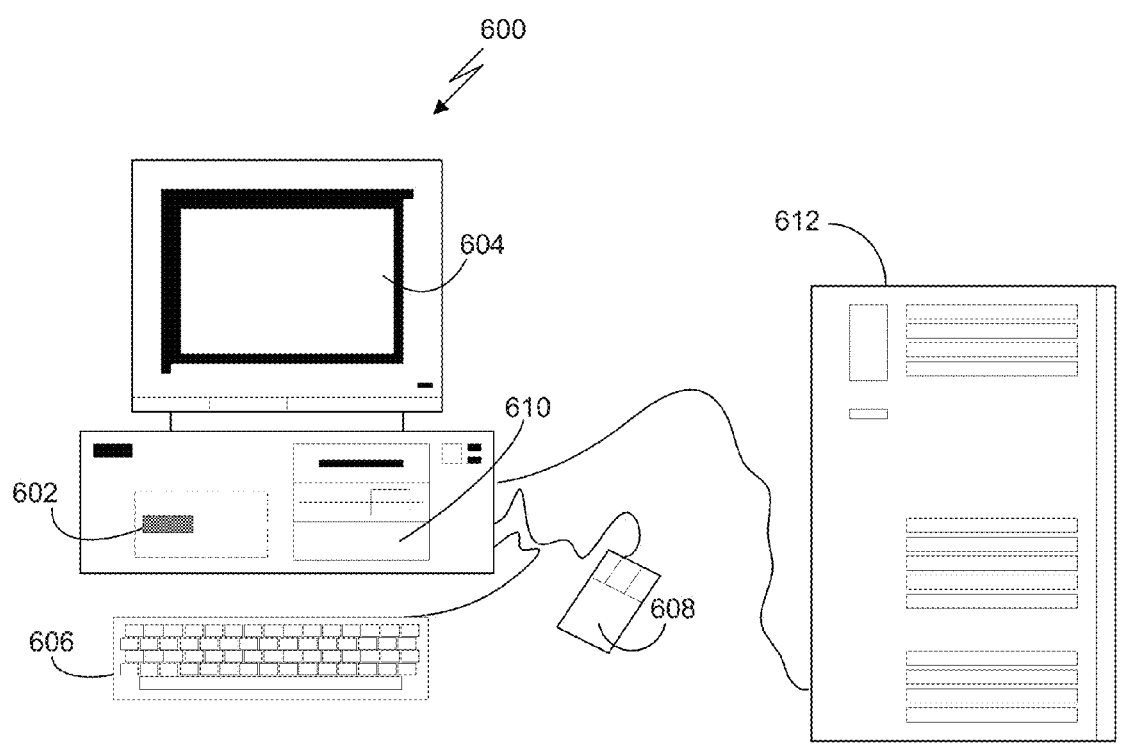
FIG. 6 is a schematic diagram of a computer system in which embodiments of the present invention are implemented.

Referring now to FIG. 6, a computerized modeling system 600 is shown and includes a CPU 602, a computer monitor 604, a keyboard input device 606, a mouse input device 608, and a storage device 610. The CPU 602, computer monitor 604, keyboard 606, mouse 608, and storage device 610 can include commonly available computer hardware devices. For example, the CPU 602 can include an Intel®based processor. The mouse 608 may have conventional left and right buttons that the user may press to issue a command to a software program being executed by the CPU 602. As an alternative or in addition to the mouse 608, the computerized modeling system 600 can include a pointing device such as a trackball, touch-sensitive pad, or pointing device and buttons built into the keyboard 606. Those of ordinary skill in the art appreciate that the same results described herein with reference to a mouse device can be achieved using another available pointing device. Other appropriate computer hardware platforms are suitable as will become apparent from the discussion that follows. Such computer hardware platforms are preferably capable of operating the Microsoft® Windows® NT, Windows 2000, Windows XP, Windows ME, Windows 7, UNIX, Linux, or MAC OS operating systems.

Additional computer processing units and hardware devices (e.g., rapid prototyping, video, and printer devices) may be included in the computerized modeling system 600. Furthermore, the computerized modeling system 600 may include network hardware and software thereby enabling communication to a hardware platform 612, and facilitating communication between numerous computer systems that include a CPU and a storage system, among other computer components.

Computer-aided modeling software of the present invention may be stored on the storage device 610 and loaded into and executed by the CPU 602. The modeling software allows a user to create and modify a 3D model and implements aspects of the invention described herein. The CPU 602 uses the computer monitor 604 to display a 3D model and other aspects thereof as described. Using the keyboard 606 and the mouse 608, the user can enter and modify data associated with the 3D model. The CPU 602 accepts and processes input from the keyboard 606 and mouse 608. The CPU 602 processes the input along with the data associated with the 3D model and makes corresponding and appropriate changes to that which is displayed on the computer monitor 604 as commanded by the modeling software. In one embodiment, the modeling software is based on a solid modeling system that may be used to construct a 3D model consisting of one or more solid and surface bodies.

The invention may be implemented in digital electronic circuitry, or in computer hardware, firmware, software, or in combinations thereof. Apparatus of the invention may be implemented in a computer program product tangibly embodied in a machine-readable storage device for execution by a programmable processor; and method steps of the invention may be performed by a programmable processor executing a program of instructions to perform functions of the invention by operating on input data and generating output. The invention may advantageously be implemented in one or more computer programs that are executable on a programmable system including at least one programmable processor coupled to receive data and instructions from, and to transmit data and instructions to, a data storage system, at least one input device, and at least one output device. Each computer program may be implemented in a high-level procedural or object-oriented programming language, or in assembly or machine language if desired; in any case, the language may be a compiled or interpreted language. Suitable processors include, by way of non-limiting example, both general and special purpose microprocessors. Generally, a processor will receive instructions and data from a read-only memory and/or a random access memory and in some embodiments instructions and data may be downloaded through a global network. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing may be supplemented by, or incorporated in, custom-designed ASICs (application-specific integrated circuits).

An advantage of the present invention is that a single virtual body represents the non-motor parts in the computer-aided design model regardless of the complexity of the model. Doing so and conceptually treating the mass or inertia as increasing and decreasing over time, which is unusual for real-world objects, enables a law of motion to be applied to reflected mass and reflected inertia. Another advantage is that automatic computation of the time variation of reflected mass and/or reflected inertia enables engineers to design more efficient motors. When the results of the computations are presented as curves, the design engineer can easily ascertain the minimum, maximum, and average or RMS values of reflected mass and reflected inertia, and then select or design an appropriate motor for the model. Other advantages include more exact results for a given model of the mechanism than can be achieved via manual calculations, the location of the motor can easily be changed and the properties recomputed, the results can be computed quickly and efficiently thereby giving design engineers prompt feedback and enabling quick "what-if" analyses, and the effect of external loads such as gravity, friction, and external forces are accounted for.

A number of embodiments of the present invention have been described. Nevertheless, it will be understood that various modifications may be made without departing from the spirit and scope of the invention. For example, when determining the location on a motor's shaft where the reflected mass or reflected inertia will be sensed, some embodiments for modeling purposes may simply select a center location of the motor or the geometry that represents a motor. Implementations may also change the order in which operations are performed. Furthermore, depending on the needs of an implementation, particular operations described herein may be implemented as a combined operation, eliminated, added to, or otherwise rearranged. For example, running the dynamic simulation (step 410 in FIG. 4) and running the dynamic solver (step 420 in FIG. 4) may be combined as one simulation step.

Accordingly, other embodiments are within the scope of the following claims.

What is claimed is:

1. A computer-implemented method for computing a reflected property of a real-world object represented as a three-dimensional (3D) model generated by a computer-aided design (CAD) modeling system, the method comprising:
   in the CAD modeling system, constructing a plurality of components of the 3D model representing the real-world object, wherein one component of the plurality of components is a motor component and represents a motor in the real-world object, and remaining components of the plurality of components are non-motor components corresponding to other components of the real-world object;
   representing in the CAD modeling system the plurality of non-motor components of the 3D model as a single virtual body;
   creating in the CAD modeling system a formulation for determining a time variation of a reflected property of the 3D model, wherein:
   the reflected property is one of reflected mass and reflected inertia;
   if the motor is a linear motor, the formulation determines how a mass of the single virtual body representing the non-motor components changes over time and the mass at a specific time is the reflected mass of the 3D model at the specific time; and
   if the motor is a rotary motor, the formulation determines how an inertia of the single virtual body representing the non-motor components changes over time and the inertia at the specific time is the reflected inertia of the 3D model at the specific time;
   calculating a set of values of the reflected property with respect to time by:
   (i) executing in the CAD modeling system a dynamic simulation computer program that simulates behavior of the real-world object represented by the 3D model having the motor component and the non-motor components, wherein:
   the dynamic simulation interacts with a solver that provides inputs to the formulation, and
   the inputs are at least one of velocity data, acceleration data, force data, and torque data, and not model geometry; and
   (ii) in the CAD modeling system applying the formulation to the 3D model, wherein said applying the formulation uses the at least one of velocity data, acceleration data, force data, and torque data, instead of model geometry alone, and determines the time variation of the reflected mass of the 3D model when the motor is a linear motor and the time variation of the reflected inertia of the 3D model when the motor is a rotary motor, and wherein applying the formulation further comprises determining a ratio of one of force and torque with respect to acceleration when the velocity at the specific time is a zero value and an acceleration at the specific time is non-zero; and
   presenting through the CAD modeling system information depicting one of the determined reflected mass of the 3D model as a function of time and determined reflected inertia of the 3D model as a function of time.

2. The computer-implemented method of claim 1, further comprising performing an initial conditions analysis, wherein any non-zero value represents acceleration of the single virtual body and a zero value represents the velocity of the single virtual body.

3. The computer-implemented method of claim 1, wherein presenting information further comprises displaying a graph on a computer monitor showing the one of the determined reflected mass and determined reflected inertia varying over time.

4. The computer-implemented method of claim 3, wherein the graph is created and displayed on the computer monitor while the dynamic simulation is executing.

5. The computer-implemented method of claim 1, wherein an external load is accounted for when executing the dynamic simulation.

6. The computer-implemented method of claim 4, wherein the external load is one of gravity, friction, and an external force.

7. The computer-implemented method of claim 1, wherein applying the formulation further comprises integrating one of force and torque when a velocity at the specific time is non-zero.

8. The computer-implemented method of claim 1, wherein applying the formulation further comprises using a result from a time step preceding the specific time.

9. A non-transitory computer-readable data storage medium comprising:
   instructions causing a computer to:
   in a computer-aided design (CAD) modeling system, create a computer-aided design three-dimensional (3D) model of a real-world object, wherein the real-world object comprises a motor and other real-world components;
   calculate a set of values of a reflected property with respect to time of the real-world object by:
   (i) executing in the CAD modeling system a dynamic simulation computer program that simulates behavior of the real-world object including the motor together with the other real-world components that are represented by the computer-aided design 3D model, the executed dynamic simulation calculating at least one of velocity data, acceleration data, force data, and torque data; and
   (ii) in the CAD modeling system automatically compute an associated reflected property of the computer-aided design 3D model, including a time variation of the reflected property, the automatic computing using the at least one of velocity data, acceleration data, force data, and torque data calculated by the dynamic simulation instead of model geometry alone, wherein:

the reflected property is one of reflected mass of the computer-aided design 3D model and reflected inertia of the computer-aided design 3D model;

the other real-world components are treated in the computer-aided design 3D model as a virtual body having one of a time-varying mass and a time-varying inertia;

if the motor is a linear motor, a mass of the virtual body at a specific time is the reflected mass of the computer-aided design 3D model at the specific time;

if the motor is a rotary motor, an inertia of the virtual body at the specific time is the reflected inertia of the computer-aided design 3D model at the specific time; and to automatically compute the reflected property when the velocity at the specific time is a zero value and an acceleration at the specific time is non-zero, a ratio of one of force and torque with respect to acceleration is determined; and through the CAD modeling system depict one of the computed reflected mass of the computer-aided design 3D model as a function of time and the computed reflected inertia of the computer-aided design 3D model as a function of time.

10. The non-transitory computer-readable data storage medium of claim 9, further comprising instructions causing the computer to create a graph of the reflected property, wherein:

if the motor is a linear motor, the graph depicts how the mass of the virtual body changes over a time interval; and if the motor is a rotary motor, the graph depicts how the inertia of the virtual body changes over a time interval.

11. The non-transitory computer-readable storage medium of claim 10, further comprising instructions causing the computer to create and display the graph while the simulation is executing.

12. The non-transitory computer-readable storage medium of claim 9, wherein to automatically compute the reflected property when a velocity at the specific time is non-zero, one of force and torque is integrated.

13. The non-transitory computer-readable storage medium of claim 9, wherein to automatically compute the reflected property, a result from a time step preceding the specific time is used.

14. A computer-aided design modeling system comprising:

a processor operatively coupled to a data storage system, the data storage system storing a three-dimensional model representing a real-world object comprised of a motor component and non-motor components; and a data storage memory operatively coupled to the processor and comprising instructions to configure the processor to:

execute in the computer-aided design modeling system a dynamic simulation computer program that simulates behavior of the real-world object including the motor and the non-motor components represented by the three-dimensional model, said execution resulting in calculated data including at least one of velocity data, acceleration data, force data, and torque data;

automatically compute a corresponding reflected property in the three-dimensional model, including a time variation of the reflected property, said automatic computing using the calculated data resulting from the dynamic simulation instead of model geometry alone, wherein:

the reflected property is one of reflected mass of the three-dimensional model and reflected inertia of the three-dimensional model;

the non-motor components are treated in the three-dimensional model as a virtual body having one of a time-varying mass and a time-varying inertia;

if the motor is a linear motor, a mass of the virtual body at a specific time is the reflected mass of the three-dimensional model at the specific time;

if the motor is a rotary motor, an inertia of the virtual body at the specific time is the reflected inertia of the three-dimensional model at the specific time; and to automatically compute the reflected property when the velocity at the specific time is a zero value and an acceleration at the specific time is non-zero, a ratio of one of force and torque with respect to acceleration is determined; and output with the three-dimensional model a depiction of one of the computed reflected mass of the three-dimensional model as a function of time and the computed reflected inertia of the three-dimensional model as a function of time.

15. The computer-aided design system of claim 14, further comprising instructions for causing the processor to create a graph of the reflected property, wherein:

if the motor is a linear motor, the graph depicts how the mass of the virtual body changes over a time interval; and if the motor is a rotary motor, the graph depicts how the inertia of the virtual body changes over a time interval.

16. The computer-aided design system of claim 14, wherein to automatically compute the reflected property when a velocity at the specific time is non-zero, one of force and torque is integrated.

17. The computer-aided design system of claim 14, wherein to automatically compute the reflected property, a result from a time step preceding the specific time is used.

* * * * *